United States Patent [19]

Bahnsen et al.

[11] 4,361,967
[45] Dec. 7, 1982

[54] DEVICE FOR COOLING FRESHLY-SOLDERED CIRCUIT BOARDS

[75] Inventors: Heiner Bahnsen, Augsburg; Dietrich Rumpf, Munich, both of Fed. Rep. of Germany

[73] Assignee: Siemens Aktiengesellschaft, Berlin & Munich, Fed. Rep. of Germany

[21] Appl. No.: 171,196

[22] Filed: Jul. 22, 1980

[30] Foreign Application Priority Data

Aug. 9, 1979 [DE] Fed. Rep. of Germany ....... 2932398

[51] Int. Cl.$^3$ .............................................. F26B 15/10
[52] U.S. Cl. ........................................ 34/151; 34/20; 34/158; 34/162; 34/163; 118/69; 228/46
[58] Field of Search ................... 29/839, 840; 228/20, 228/46, 222; 118/63, 69; 34/151, 155, 158, 20, 162, 163, 160

[56] References Cited

U.S. PATENT DOCUMENTS

| | | | |
|---|---|---|---|
| 2,730,982 | 1/1956 | Socke | 228/46 |
| 3,429,057 | 2/1969 | Thygeson, Sr. | 34/160 |
| 3,579,853 | 5/1971 | Martino | 34/160 |
| 3,605,244 | 9/1971 | Osborne et al. | 21/471.1 |
| 3,827,639 | 8/1974 | Relue et al. | 34/156 |
| 4,137,649 | 2/1979 | Fleissner | 34/158 |

*Primary Examiner*—Larry I. Schwartz
*Attorney, Agent, or Firm*—Hill, Van Santen, Steadman, Chiara & Simpson

[57] ABSTRACT

Electrical circuit boards are cooled immediately after passing through a soldering work station wherein heat-sensitive electrical components are mechanical soldered into such circuit boards so as to minimize dangerous temperature peaks without disrupting the soldering process. The cooling device is positioned closely adjacent to the soldering work station and comprises a housing having a C-shaped passageway along the center thereof for receiving an elongated transport means carrying freshly-soldered circuit boards in a given direction from the solder soldering work station. Air flow means are provided at opposite wall portions of the passageway for directing a stream of cooling air against opposite sides of the circuit boards carried by the transport means and approximately at right angles to the travel directions of such boards.

5 Claims, 4 Drawing Figures

DEVICE FOR COOLING FRESHLY-SOLDERED CIRCUIT BOARDS

BACKGROUND OF THE INVENTION

1. Field of the Invention

The invention relates to devices for fabricating circuit boards and somewhat more particularly to devices for cooling freshly-soldered circuit boards after a mechanical soldering of heat-sensitive electrical components into such boards.

2. Prior Art

Mechanical soldering of heat-sensitive electrical components into circuit boards typically occurs at soldering temperatures in excess of 240° C. Such relatively high temperatures jeopardize the electrical components, particularly where the allowable peak temperature is exceeded. Dynamic temperature measurements carried out on circuit boards undergoing fabrication have shown that the maximum temperature experienced by a circuit board occurs only after the actual soldering process for a component is completed. By cooling freshly-soldered components or circuit boards immediate after a soldering process, this dangerous temperature peak can be reduced in such a way that the components are unlikely to be jeopardized. Cooling of freshly-soldered components on circuit boards is generally carried out with compressed air which is blown through nozzles toward the soldered surface of the components and/or boards. These nozzles are arranged in one or more rows and directed obliquely toward freshly-soldered surfaces of the components/boards so that the freshly applied and essentially still liquid solder is not blasted away. The cooling effect, naturally, increases in proportion to the number of nozzles used and in proportion to the air speed (pressure) used.

The positioning of a plurality of nozzles involves structual difficulties, particularly when the cooling device is directly adjacent a solder bath or a soldering work station. The high air speed itself not only results in unsettled surrounding air but also increases the amount of wasted solder since the air flow extends over the surface of the closely adjacent soldering bath. Further, poor soldering results are achieved and compressed air systems are costly and potentially dangerous.

SUMMARY OF THE INVENTION

The invention provides a cooling device for freshly-soldered circuit boards and the like which effectively cools freshly-soldered surfaces and reduces required structural outlays.

In accordance with the principles of the invention, a circulating, substantially closed air circuit is provided about freshly-soldered circuit boards in such a manner that air flows around the circuit boards from both sides and approximately at right angles to the direction of circuit board travel through the cooling device. The closed air cycle restricts the cooling effect directly to the region of the cooling device and the air motion reaches its maximum at locations where the to-be cooled circuit boards are arranged.

In preferred embodiments of the invention, air outlet openings are provided along opposite sides of a transport means carrying freshly-soldered circuit boards through the cooling device and these air outlet openings are arranged in such a manner that the air flow is directed at an obtuse angle toward the two major surfaces of freshly-soldered circuit boards. In certain embodiments, the circulating air stream can be cooled, as by being in operational association with a water-cooled heat exchanger. Circulation of the air stream can be attained in a relatively simple manner as by two appropriately positioned transverse flow fans or by a single flow fan arranged to suck air from one area of the cooling device and directed it onto the surfaces of the freshly-soldered circuit boards being cooled.

DESCRIPTION OF THE PREFERRED EMBODIMENTS

Figure 1:
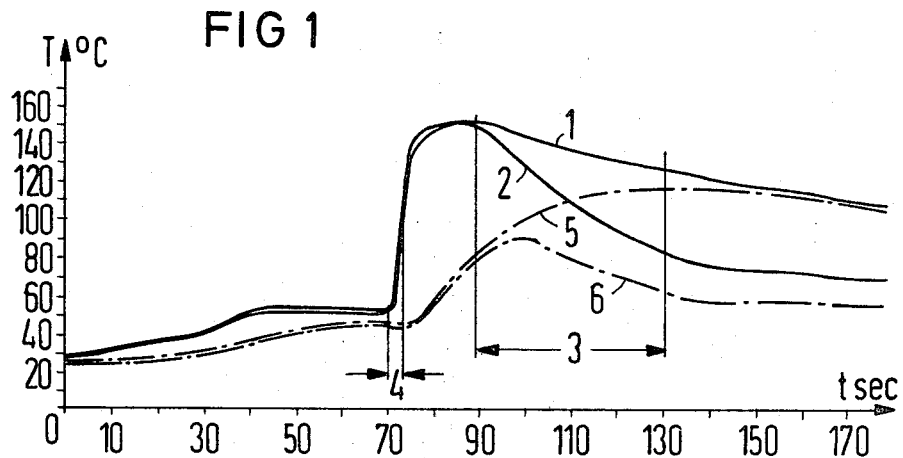
FIG. 1 is a graphical illustration showing the relationship between time and temperature on a multi-layer circuit board and on a component therein which is provided with cooling in comparison with a component which is not provided with cooling.

Referring now to FIG. 1, the temperature curve 1 illustrates the temperature-time relationship of a circuit board undergoing mechanical soldering and which is not provided with cooling. Curve 2 illustrates the temperature-time relationship of a similar circuit board which is provided with cooling. In these curves, the cooling zone is indicated by arrow 3. As can be seen, at the beginning of the cooling process, i.e, after approximately 90 seconds, curves 1 and 2 are practically identical, however after the onset of the cooling, curve 2 falls steeply. The region in which the actual soldering process takes place is indicated by the zone designated with reference numeral 4. After the soldering process, the temperature in the circuit board continues to raise considerably, as indicated by curves 1 and 2.

The temperature-time curve 5 indicates the temperature of a component which is soldered into a circuit board and which is not provided with cooling whereas the curve 6 indicates the temperature-time relationship of a component provided with cooling. Curve 6 clearly demonstrates that any danger of over-heating a component during soldering can be considerably reduced by providing cooling immediately after soldering.

Figure 2:
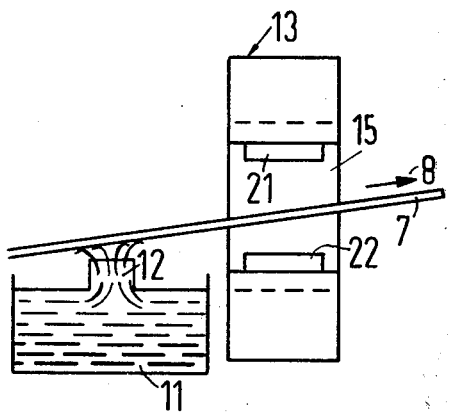
FIG. 2 is an elevated highly schematic front view of an embodiment of a cooling device of the invention in association with a soldering bath.
Figure 3:
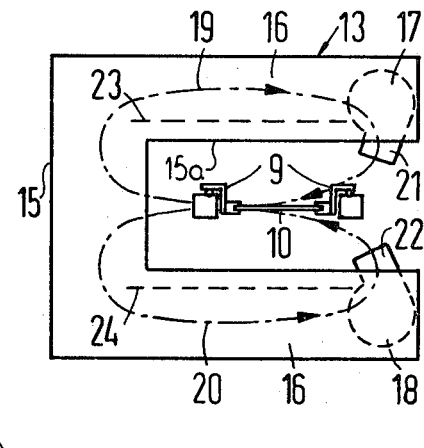
FIG. 3 is, essentially, a schematic side view of the cooling device illustrated in FIG. 2.

Referring now to FIG. 2, a transport means 7 is provided for supporting a plurality of spaced-apart circuit boards thereon (not shown for sake of clarity). The transport means 7 conveys appropriate circuit boards obliquely upwardly in the direction of arrow 8. Typically, circuit boards 10 are supported on a suitable transport means by means of clips 9, as shown in FIG. 3 so that the opposing major surfaces of each board are uncovered for free acesses to surrounding air. Appropriately prepared circuit boards 10 are conveyed across a soldering bath 11 wherein molten solder surges out through a chimney 12 and wets the underside of the circuit boards 10 while appropriate electrical components are inserted into the circuit boards 10 from above. A cooling device 13 is positioned closely adjacent to the solder bath 11 and functions to cool the freshly-soldered circuit boards. Generally, the cooling device 13 comprises a means defining a circulating, substantially closed air stream, a passageway for receiving the transport means supporting freshly-soldered circuit boards thereon in such a manner that opposite sides of such boards are uncovered and which conveys such boards in a given travel direction through the passageway, and air guide means operationally associated with the air stream for directing air flow against the opposite sides of the freshly-soldered circuit boards on the transport means and at approximately right angles to the travel directions of such boards so that effective cooling takes place.

In the embodiment illustrated at FIG. 3, the cooling device 13 essentially comprises a housing 15 having a somewhat C-shaped central passageway 15a for allowing material to travel through the housing in a given direction. The housing is provided with an appropriate air flow channel, as by baffles 23 and 24 to allow circulating air to travel through the housing and into the central passageway. 15a. Transverse flow fans 17 and 18 are positioned at the outer ends of walls 16 for directing air into the central passageway and through the closed air circuits schematically indicated by broken lines 19 and 20. As can be seen, the air outlet openings 21 and 22 of the flow fans 17 and 18 are directed at an obtuse angle toward the circuit board 10 so that the cooling air flows around the circuit board and thus effectively cools both major surfaces of the circuit board 10. The curtain or stream of air thus formed is limited to the region of the actual cooling device 13 and does not effect the surrounding air. Further, the maximum air motion occurs substantially in the center passageway of the device 13, through which the circuit boards 10 move at substantially right angles.

By keeping the air stream in circulation, large structural cross-sections are not necessary for supplying and discharging air. In certain embodiments, the cooling device 13 can include a water-cooling means in operational association with the air circuit so as to cool the same, for example, a cooling coil in heat-exchange relationship with a flow water and the air stream. The moving air stream, whether externally cooled or not, is effective in reducing the temperature peak, for example as shown in FIG. 1.

Figure 4:
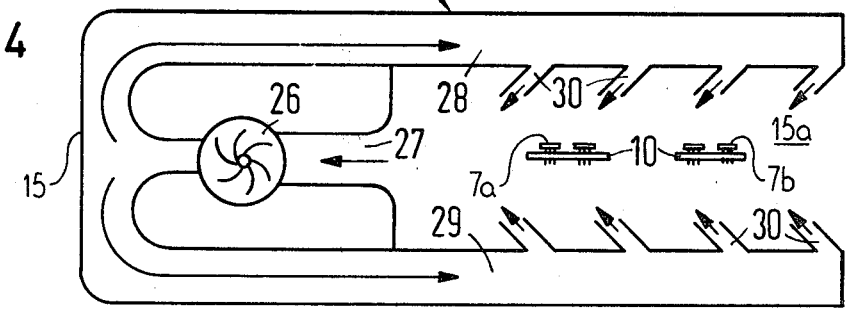
FIG. 4 illustrates another embodiment of a cooling device constructed and operable in accordance with the principles of the invention.

FIG. 4 illustrates a presently preferred exemplary embodiment of a cooling device of the invention. In this arrangement, a centrally positioned air fan 26 sucks in cooling air through a conduit 27 from the central passageway 15a and directs such air through two spaced-apart cooling channels 28 and 29 located on either side of the central passageway 15a, through a plurality of spaced-apart, parallelly-disposed air outlet openings 30 and back into the central passageway. The cooling air flows out of openings 30 and flows around circuit boards 10 on the opposing major surfaces thereof, which are, uncovered so that the air comes into intimate contact therewith and cools the same. In the embodiment illustrated at FIG. 4, a pair of transport means 7a and 7b are arranged so as to travel parallel to one another and at right angles to the plane of the drawing. As can be seen, the curtain of air formed in this manner is restricted to the region of the cooling device and does not impinge upon a closely adjacent soldering bath or solder work station. The width and/or spacing of the air outlet openings 30 can be selected as desired so that the cooling zone can be extended or shortened as desired.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a device for cooling printed circuit boards after mechanical soldering of heat-sensitive electrical components into such boards with the aid of a cooling air stream which is circulated in a substantially closed circuit with the aid of a fan means and a means for transporting such board past the air stream, wherein the improvement comprises:
   a somewhat C-shaped housing defining said closed circuit and positioned approximately perpendicular relative to a transport direction of said boards and embracing said means for transporting such boards at a distance with a pair of horizontally extending legs, each of said legs having air-outlet openings on surfaces thereof facing said boards, said air-outlet openings beings disposed at least at outer ends of said legs and being directed against opposite sides of said boards at an obtuse angle,
   said housing having a central opening therein allowing cooling air to be sucked-in via said opening and expelled through said legs to said air-outlet openings to establish an air current about said circuit boards, and
   said means for transporting such boards past the air stream comprising a transport means supporting freshly-soldered circuit boards only at their respective side edges in such a manner that opposite major surfaces of such boards are uncovered.

2. In a device as defined in claim 1 wherein a pair of opposingly discharging air fans are each respectively associated with said air-outlet openings.

3. In a device as defined in claim 1 wherein said air-outlet openings comprise a plurality of individual air-outlet passageways arranged parallel to one another and disposed along facing surfaces of said legs.

4. A device for cooling circuit boards after mechanical soldering of heat-sensitive electrical components into such boards, comprising:
   a housing having a central passageway there through for allowing a transport means to travel through said housing in a given direction, said transport means supporting freshly-soldered circuit boards only at their respective side edges in such a manner that opposite major surfaces of such boards are uncovered, said transport means conveying a plurality of spaced-apart freshly-soldered circuit boards through said central passageway of the housing, said housing having an air flow channel allowing a circulating air stream to travel through said housing and said central passageway; and
   air circulating means operationally associated with said air flow channel in said housing for circulating a substantially closed air stream through said channel and said passageway and at an obtuse angle against said opposite major surfaces of the circuit boards supported by the transport means within said central passageway.

5. A device as defined in claim 4 wherein said air circulating means comprise an air fan positioned within said air flow channel to suck air from said central passageway and circulate such air through the flow channel back to said central passageway.

* * * * *